(12) United States Patent
Fairchild et al.

(10) Patent No.: US 7,205,652 B2
(45) Date of Patent: Apr. 17, 2007

(54) ELECTRONIC ASSEMBLY INCLUDING MULTIPLE SUBSTRATES

(75) Inventors: M. Ray Fairchild, Kokomo, IN (US);
Dwadasi H. R. Sarma, Kokomo, IN (US); Derek B. Workman, Noblesville, IN (US); Daniel R. Harshbarger, Kokomo, IN (US)

(73) Assignee: Delphi Technologies, Inc, Troy, MI (US)

( * ) Notice: Subject to any disclaimer, the term of this patent is extended or adjusted under 35 U.S.C. 154(b) by 0 days.

(21) Appl. No.: 11/088,101

(22) Filed: Mar. 23, 2005

(65) Prior Publication Data

US 2006/0214299 A1 Sep. 28, 2006

(51) Int. Cl.
*H01L 23/10* (2006.01)
*H01L 23/12* (2006.01)
*H01L 23/053* (2006.01)

(52) U.S. Cl. ............ 257/710; 257/700; 257/706; 257/707; 257/708; 257/710; 257/711; 257/712; 257/713; 257/635; 257/747; 257/734; 257/739; 257/E39.009; 257/E38.015; 257/E39.018

(58) Field of Classification Search ............... None
See application file for complete search history.

(56) References Cited

U.S. PATENT DOCUMENTS

| 6,365,978 B1* | 4/2002 | Ibnabdeljalil et al. ....... 257/786 |
| 2004/0140544 A1* | 7/2004 | Naka et al. ................. 257/678 |
| 2004/0238942 A1* | 12/2004 | Chakravorty et al. ....... 257/700 |

* cited by examiner

*Primary Examiner*—Jasmine Clark
(74) *Attorney, Agent, or Firm*—Jimmy L Funke

(57) ABSTRACT

An electronic assembly includes a first substrate and a second substrate. The first substrate includes a first surface having a first plurality of conductive traces formed on an electrically non-conductive layer. The second substrate includes a first surface having a second plurality of conductive traces formed thereon and a second surface having a third plurality of conductive traces formed thereon. A first electronic component is electrically coupled to one or more of the plurality of conductive traces on the first surface of the second substrate. At least one of a plurality of conductive interconnects is incorporated within each solder joint that electrically couples one or more of the conductive traces formed on the second surface of the second substrate to one or more of the conductive traces formed on the first substrate.

20 Claims, 2 Drawing Sheets

US 7,205,652 B2

ELECTRONIC ASSEMBLY INCLUDING MULTIPLE SUBSTRATES

TECHNICAL FIELD

The present invention is generally directed to an electronic assembly and, more specifically, to an electronic assembly including multiple substrates.

BACKGROUND OF THE INVENTION

Various manufacturers have offered electronic assemblies including multiple substrates, at least one of which has been a low-temperature co-fired ceramic (LTCC) substrate. In general, LTCC substrates allow for electronic assemblies that have relatively high-density circuitry. However, in electronic assemblies that have incorporated an LTCC substrate, it is often desirable to configure the assembly to improve the thermal conductivity of the LTCC substrate, as LTCC substrates have a relatively low thermal conductivity of approximately 3 Wm/K. This is particularly desirable when LTCC substrates are utilized in high-power applications. In at least one prior art electronic assembly that utilizes multiple substrates, an LTCC substrate has been wirebonded to another substrate. In this assembly, an adhesive bond has been provided in the primary thermal path between the substrates. An additional substrate, which increases the overall package size, has also been implemented within the assembly to improve the thermal conductivity of the electronic assembly. Unfortunately, the utilization of wirebonds between the substrates increases lead inductance and, as such, results in degraded electrical performance of the electronic assembly. Further, application of the adhesive requires an adhesive dispense operation, which increases the process time and cost of the assembly.

What is needed is a multiple substrate electronic assembly that exhibits improved thermal conductivity at a lower cost for both components and manufacturing.

SUMMARY OF THE INVENTION

The present invention is generally directed to an electronic assembly that includes a first substrate and a second substrate. The first substrate includes a first surface having a first plurality of conductive traces formed on an electrically non-conductive layer. The second substrate includes a first surface having a second plurality of conductive traces formed thereon and a second surface having a third plurality of conductive traces formed thereon. A first electronic component is electrically coupled to one or more of the plurality of conductive traces on the first surface of the second substrate. At least one conductive interconnect is incorporated within each solder joint that electrically couples one or more of the conductive traces formed on the second surface of the second substrate to one or more of the conductive traces formed on the first substrate.

In order to create increased thermal conductivity, the first substrate may be a metal substrate. According to another embodiment of the present invention, the metal substrate may be a stainless steel substrate. According to a different embodiment of the present invention, the second substrate may be a low-temperature co-fired ceramic (LTCC) substrate. The assembly may also include an overmold material enclosing the second substrate and covering at least a portion of the first substrate. The assembly may also include a no-flow underfill material positioned between the first and second substrates. In this case, a coefficient of thermal expansion (CTE) of the underfill material may be selected to substantially match CTEs of the first and second substrates.

According to a different aspect of the present invention, the conductive interconnects each include a spherical polymer core and a conductive outer layer with an affinity for solder. In one embodiment, the second substrate has a thermal conductivity of about 3 Wm/K or less. According to a different aspect of the present invention, at least one second electronic component is electrically coupled to one or more of the conductive traces formed on the first substrate. According to a different aspect, at least a portion of the first substrate functions as an enclosure for the assembly.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

As is mentioned above, a variety of different design solutions have been proposed to improve the thermal capability of electronic assemblies that have utilized substrates, e.g., low-temperature co-fired ceramic (LTCC) substrates, that exhibit relatively low thermal conductivity in high-power applications. As is noted above, one such prior art electronic assembly offers a two substrate solution that requires wirebonds between the substrates and an adhesive bond in a primary thermal path of the electronic assembly. According to the present invention, a number of different packaging technologies are utilized to create a two substrate approach for high-power applications.

In one electronic assembly, an LTCC substrate and a stainless steel substrate are utilized. In this assembly, a high-density LTCC substrate is attached to an insulated stainless steel substrate in a manner similar to how surface mount components are mounted to a substrate. This eliminates the need for wirebonding between the two substrates. The insulated stainless steel substrate may provide electrical interconnect to all semiconductor power devices, a primary thermal path for the power devices and an external metal base plate that may be utilized as a component of the package for the electronic assembly.

According to the present invention, semiconductor power devices may be removed from the LTCC substrate and placed on an insulated portion of the stainless steel substrate. In general, the thermal resistance of the insulated stainless steel substrate is equivalent to the stack-up of an alumina substrate that is adhesively bonded to an aluminum base plate. According to the present invention, wirebonds between the substrates are eliminated and adhesive bond lines and adhesive dispense operations are eliminated. This two substrate approach, according to the present invention, provides a vertically integrated electronic assembly with dual substrates with improved thermal management. According to one embodiment of the present invention, a "solderable microsphere" may be utilized to provide a desired stand-off distance between the two substrates, so as to increase solder joint reliability and to readily allow for the use of an underfill. As used herein, the term "solderable microsphere" broadly includes a conductive interconnect having a polymer core and an electrically conductive solderable outer surface.

Figure 1:
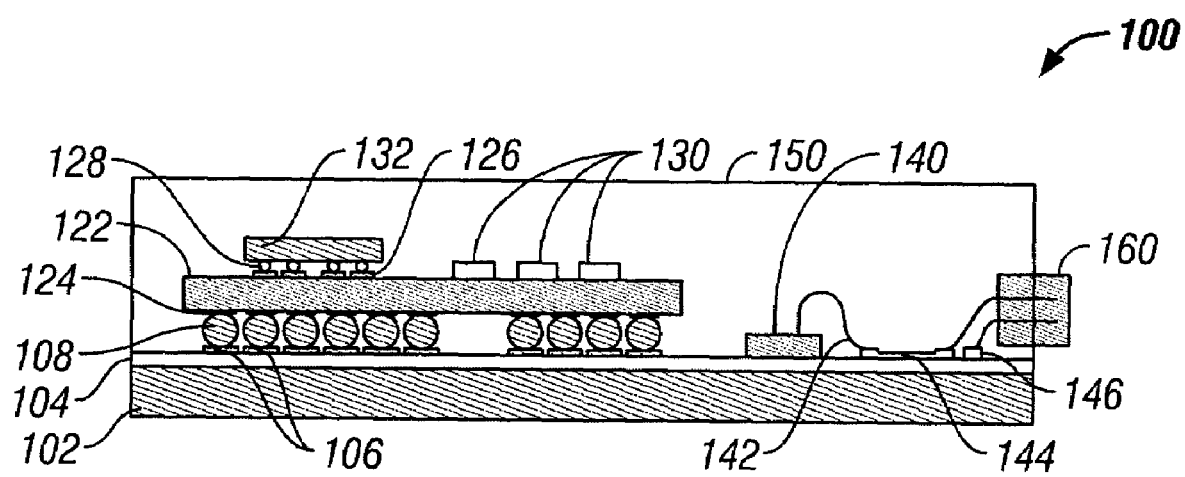
FIG. 1 depicts a partial cross-sectional view of a relevant portion of an overmolded electronic assembly, constructed according to one embodiment of the present invention, including two substrates.
Figure 2:
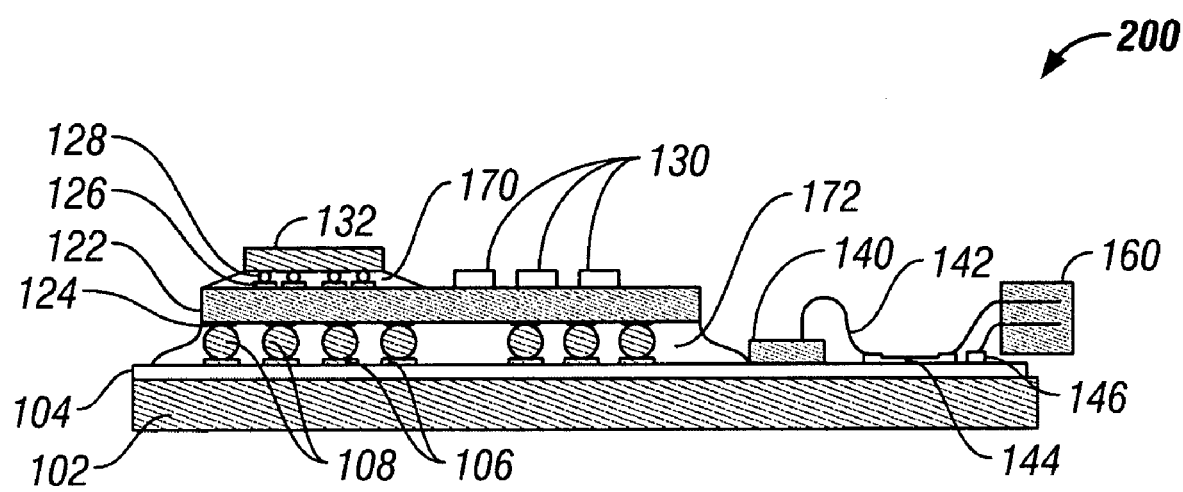
FIG. 2 depicts a partial cross-sectional view of a relevant portion of an electronic assembly, constructed according to another embodiment of the present invention, including a flip chip and a substrate that are underfilled.

According to the present invention, a no-flow type or other underfill material may be utilized between two dissimilar substrates (see FIG. 2). Furthermore, an overmold may be utilized to environmentally isolate an electronic assembly and provide an underfill between the two substrates (see FIG. 1). In this case, it is desirable for the overmold material to substantially match the coefficient of thermal expansion (CTE) of the two different substrates. According to the present invention, an LTCC substrate may be utilized for one circuit, e.g., an ignition circuit, and a stainless steel substrate may be utilized for another circuit, e.g., an engine control module. It should be appreciated that other substrate combinations may be implemented according to the present invention. For example, a beryllium oxide (BeO)/LTCC substrate combination, an alumina/LTCC substrate combination or a stainless steel/alumina substrate combination may be utilized within an electronic assembly.

According to the present invention, lead inductance is minimized between the substrates, as the electrical connection between the substrates is made with a solderable microsphere instead of a wirebond. Further, when a stainless steel substrate is implemented, the stainless steel substrate provides a good ground plane for improved electromagnetic compatibility (EMC) performance. The two substrate approach allows integration of dissimilar circuits, such as a microprocessor (for control) with an insulated gate bipolar transistor (IGBT) (for power drivers for ignition coils) or a field-effect transistor (FET) (for transmission control). Furthermore, high-power resistors and other components can be directly printed on a dielectric layer formed on the stainless steel substrate, which further eliminates power dissipation concerns with package and placement operations. Advantageously, the LTCC substrate can be pre-tested prior to assembly with the stainless steel substrate, which eliminates adhesive dispense and pick and place operations that are typical in hybrid module assemblies. As noted above, the implementation of an overmold eliminates epoxy underfill and passivation dispense requirements.

With reference to FIG. 1, an electronic assembly 100 is depicted that includes a first substrate 102 and a second substrate 122. The first substrate 102 includes a non-conductive layer 104, formed on a surface of the substrate 102. A plurality of conductive traces 106 are formed on the non-conductive layer 104 and, in conjunction with conductive interconnects 108, serve to interconnect the substrates 102 and 122. As is shown in FIG. 1, the conductive interconnects 108 are positioned between traces 106, which are formed on the non-conductive layer 104 on the substrate 102, and traces 124, which are formed on a second surface of the second substrate 122. A plurality of electronic components 130 and 132 are mounted on a first surface of the second substrate 122. As is shown in FIG. 1, a plurality of solder bumps 128 interconnect the component, e.g., a flip-chip, 132 to a plurality of conductive traces 126 (formed on the first surface of the second substrate 122). A power device, such as an IGBT or FET, 140 is positioned on the first substrate 102 and is interconnected to devices on the second substrate 122, via electrical traces (not shown) formed on the insulated layer 104 of the first substrate 102. As is shown, the device 140 is electrically coupled to a pin of connector 160, via a wirebond 142, which is coupled to a thick-film pad 144. Another pin of the connector 160 is coupled to another thick-film pad 146, via another wirebond. The connector 160 is used to connect the electronic assembly 100 to an external device. As is shown, an overmold, e.g., an epoxy resin, 150 environmentally seals various components of the electronic assembly 100. It should be appreciated that an electronic assembly constructed according to the various embodiments of the present invention eliminates the need for wirebonds between substrates. To the extent that wirebonds are required, their use is primarily limited to the electrical interconnection of high-power devices.

With reference to FIG. 2, an electronic assembly 200, which is similar to the electronic assembly 100 of FIG. 1, is depicted in cross-section. The assembly 200 is essentially the same as the assembly 100, with the exception that an underfill material 172 has been utilized between the substrates 102 and 122 and an underfill material 170 has been utilized between the semiconductor device 132 and the second substrate 122, in lieu of the overmold material 150.

Accordingly, electronic assemblies have been described herein, which are relatively economical to produce, and exhibit improved thermal and electrical performance over prior art assemblies that have implemented multiple substrates interconnected with wirebonds.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An electronic assembly, comprising:
   a first substrate including a first surface having a first plurality of conductive traces formed on an electrically non-conductive layer;
   a second substrate including a first surface having a second plurality of conductive traces formed thereon;
   a first electronic component electrically coupled to one or more of the plurality of conductive traces on the first surface of the second substrate;
   at least one second electronic component electrically coupled to one or more of the conductive traces on the first substrate; and
   a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate.

2. The assembly of claim 1, wherein the metal substrate is a stainless steel substrate.

3. The assembly of claim 1, wherein the second substrate is a low-temperature co-fired ceramic (LTCC) substrate.

4. An electronic assembly, comprising:
   a first substrate including a first surface having a first plurality of conductive traces formed on an electrically non-conductive layer;

a second substrate including a first surface having a second plurality of conductive traces formed thereon;

a first electronic component electrically coupled to one or more of the plurality of conductive traces on the first surface of the second substrate;

at least one second electronic component electrically coupled to one or more of the conductive traces on the first substrate; and a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate.

5. An electronic assembly, comprising:

a first substrate including a first surface having a first plurality of conductive traces formed on an electrically non-conductive layer;

a second substrate including a first surface having a second plurality of conductive traces formed thereon and a second surface having a third plurality of conductive traces formed thereon;

a first electronic component electrically coupled to one or more of the plurality of conductive traces on the first surface of the second substrate; and a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate, the second substrate is a low-temperature co-fired ceramic (LTCC) substrate and the conductive interconnects each include a polymer core and a conductive outer layer with an affinity for solder.

6. The assembly of claim 5, further comprising:

an overmold material enclosing the second substrate and covering at least a portion of the first substrate.

7. The assembly of claim 5, further comprising:

a no-flow underfill material positioned between the first and second substrates, wherein a coefficient of thermal expansion (CTE) of the underfill material is selected to substantially match CTEs of the first and second substrates.

8. The assembly of claim 5, wherein the second substrate has a thermal conductivity of about 3 Wm/K or less.

9. An electronic assembly, comprising:

a first substrate including a first surface having a first plurality of conductive traces formed on an electrically non-conductive layer;

a second substrate including a first surface having a second plurality of conductive traces formed thereon and a second surface having a third plurality of conductive traces formed thereon;

a first electronic component electrically coupled to one or more of the plurality of conductive traces on the first surface of the second substrate;

a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate; and an overmold material enclosing the second substrate and covering at least a portion of the first substrate.

10. An electronic assembly, comprising:

a first substrate including a first surface having a first plurality of conductive traces formed on an electrically non-conductive layer;

a second substrate including a first surface having a second plurality of conductive traces formed thereon and a second surface having a third plurality of conductive traces formed thereon;

a first electronic component electrically coupled to one or more of the plurality of conductive traces on the first surface of the second substrate;

a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate; and a no-flow underfill material positioned between the first and second substrates, wherein a coefficient of thermal expansion (CTE) of the underfill material is selected to substantially match CTEs of the first and second substrates.

11. An electronic assembly, comprising:

a first substrate including a first surface having a first plurality of conductive traces formed on an electrically non-conductive layer;

a second substrate including a first surface having a second plurality of conductive traces formed thereon and a second surface having a third plurality of conductive traces formed thereon;

a first electronic component electrically coupled to one or more of the plurality of conductive traces on the first surface of the second substrate; and a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate, wherein the conductive interconnects each include a spherical polymer core and a conductive outer layer with an affinity for solder.

12. An electronic assembly, comprising:

a first substrate including a first surface having a first plurality of conductive traces formed on an electrically non-conductive layer;

a second substrate including a first surface having a second plurality of conductive traces formed thereon and a second surface having a third plurality of conductive traces formed thereon;

a first electronic component electrically coupled to one or more of the plurality of conductive traces on the first surface of the second substrate; and a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate, wherein the second substrate has a thermal conductivity of about 3 Wm/K or less.

13. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate;
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate; and
at least one second electronic component electrically coupled to one or more of the conductive traces formed on the first substrate.

14. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate; and
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a metal substrate,
wherein at least a portion of the first substrate functions as an enclosure for the assembly.

15. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate;
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate; and
an overmold material enclosing the second substrate and covering at least a portion of the first substrate.

16. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate;
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate; and
a no-flow underfill material positioned between the first and second substrates, wherein a coefficient of thermal expansion (CTE) of the underfill material is selected to substantially match the CTEs of the first and second substrates.

17. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate; and
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate,
wherein the conductive interconnects each include a spherical polymer core and a conductive outer layer with an affinity for solder.

18. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate; and
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate, wherein the second substrate has a thermal conductivity of about 3 Wm/K or less.

19. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate;
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate; and
at least one second electronic component electrically coupled to one or more of the conductive traces formed on the first substrate.

20. An electronic assembly, comprising:
a first substrate including a first surface having a first plurality of conductive traces formed on an electrically non-conductive layer;
a second substrate including a first surface having a second plurality of conductive traces formed thereon and a second surface having a third plurality of conductive traces formed thereon;
a first electronic component electrically coupled to one or more of the plurality of conductive traces on the first surface of the second substrate; and
a plurality of conductive interconnects, wherein at least one of the conductive interconnects is incorporated within each solder joint that electrically couples one or more of the conductive traces formed on the second surface of the second substrate to one or more of the conductive traces formed on the first substrate, and wherein the first substrate is a stainless steel substrate and the second substrate is a low-temperature co-fired ceramic (LTCC) substrate,
wherein at least a portion of the first substrate functions as an enclosure for the assembly.

* * * * *